US011807098B2

United States Patent
Alu et al.

(10) Patent No.: US 11,807,098 B2
(45) Date of Patent: Nov. 7, 2023

(54) ROTARY SELECTOR KNOB WITH GRAPHICAL DISPLAY

(71) Applicant: Kuster North America, Inc., Troy, MI (US)

(72) Inventors: Calogero Alu, Shelby Charter Township, MI (US); Christopher Soave, Oxford, MI (US)

(73) Assignee: Kuster North America, Inc., Troy, MI (US)

( * ) Notice: Subject to any disclaimer, the term of this patent is extended or adjusted under 35 U.S.C. 154(b) by 564 days.

(21) Appl. No.: 17/106,501

(22) Filed: Nov. 30, 2020

(65) Prior Publication Data
US 2021/0162866 A1    Jun. 3, 2021

Related U.S. Application Data

(60) Provisional application No. 62/942,334, filed on Dec. 2, 2019.

(51) Int. Cl.
*B60K 37/06* (2006.01)
*G02F 1/1333* (2006.01)
(Continued)

(52) U.S. Cl.
CPC .............. *B60K 37/06* (2013.01); *B60K 35/00* (2013.01); *G02F 1/13338* (2013.01);
(Continued)

(58) Field of Classification Search
CPC .................... B60K 37/06; B60K 35/00; B60K 2370/1537; B60K 2370/1523;
(Continued)

(56) References Cited

U.S. PATENT DOCUMENTS

| 4,378,474 A | 3/1983 | Olson |
| 6,568,345 B1 | 5/2003 | Paulo |

(Continued)

FOREIGN PATENT DOCUMENTS

| CN | 209030180 U | 6/2019 |
| CN | 109973640 A | 7/2019 |

(Continued)

OTHER PUBLICATIONS

International Search Report and Written Opinion issued by the Korean Intellectual Property Office acting as International Searching Authority for International Patent Application No. PCT/US2020/062705 dated Mar. 23, 2021 (8 pages).

*Primary Examiner* — Zakaria Elahmadi
(74) *Attorney, Agent, or Firm* — Dinsmore & Shohl LLP

(57) ABSTRACT

A rotary shifter having a cylindrical shaped knob with an inner circumferential surface defining an open interior and exhibiting a detent profile. A stationary inner housing is positioned within an open interior of the knob and supports outwardly biased pawls establishing an interface with the detent profile in a selected rotational position. The inner housing supports a rotating spur gear having an end secured magnet positioned above a sensor incorporated into a printed circuit board (PCB), rotation of the knob resulting in the sensor to communicate to a processor component of the PCB a given rotational position designating a given shift or mode selection. The knob includes an illuminating surface for presenting menu options of the shift or mode selection.

18 Claims, 12 Drawing Sheets

(51) Int. Cl.
  *G02F 1/13357* (2006.01)
  *B60K 35/00* (2006.01)
(52) U.S. Cl.
  CPC .. *G02F 1/133603* (2013.01); *B60K 2370/126* (2019.05); *B60K 2370/1523* (2019.05); *B60K 2370/1537* (2019.05); *B60K 2370/172* (2019.05); *B60K 2370/332* (2019.05)
(58) Field of Classification Search
  CPC ........ B60K 2370/332; B60K 2370/126; B60K 2370/172; G02F 1/13338; G02F 1/133603
  USPC ........................................................ 74/469
  See application file for complete search history.

(56) References Cited

U.S. PATENT DOCUMENTS

| | | | |
|---|---|---|---|
| 6,781,512 B2 | 8/2004 | Hayashi et al. | |
| 7,847,680 B2 | 12/2010 | Gencyuz et al. | |
| 7,965,282 B2 | 6/2011 | Yamada | |
| 7,971,498 B2 | 7/2011 | Meyer et al. | |
| 8,055,419 B2 | 11/2011 | Meng | |
| 8,581,718 B2 | 11/2013 | Muller et al. | |
| 9,383,000 B2 | 7/2016 | Tippelhofer et al. | |
| 9,863,526 B2 | 1/2018 | Hoskins et al. | |
| 10,310,603 B2 | 6/2019 | Vanhelle et al. | |
| 2004/0020760 A1 | 2/2004 | Kouznetsov | |
| 2004/0207607 A1 | 10/2004 | Specks et al. | |
| 2006/0003742 A1 | 1/2006 | Seligmann et al. | |
| 2008/0023309 A1* | 1/2008 | Montalvo | H01H 9/181 200/332 |
| 2010/0219945 A1 | 9/2010 | Schumann et al. | |
| 2012/0056761 A1* | 3/2012 | Sano | G05G 1/08 341/35 |
| 2015/0159747 A1* | 6/2015 | Hoskins | F16H 59/0217 74/473.23 |
| 2018/0087658 A1 | 3/2018 | Hoskins et al. | |
| 2018/0143754 A1 | 5/2018 | Niazi | |

FOREIGN PATENT DOCUMENTS

| | | | | |
|---|---|---|---|---|
| EP | 3225884 A1 | | 10/2017 | |
| EP | 3379370 A1 | | 9/2018 | |
| EP | 2815287 B1 | * | 5/2021 | ............. F16H 59/08 |
| GB | 2494420 A | * | 3/2013 | ............. B60K 37/06 |
| JP | 2008-153121 A | | 7/2008 | |
| JP | 2013-140723 A | | 7/2013 | |
| JP | 2013140723 A | * | 7/2013 | |
| KR | 10-2019-0042834 A | | 4/2019 | |

* cited by examiner

ROTARY SELECTOR KNOB WITH GRAPHICAL DISPLAY

CROSS REFERENCE TO RELATED APPLICATIONS

The present application claims the priority of U.S. Ser. No. 62/942,334, filed Dec. 2, 2019, the contents of which are incorporated by reference.

FIELD OF THE INVENTION

The present invention relates generally to a vehicle rotary knob with an electronic switch which can be utilized in either of drive mode or gear shift selection (PRND S/M/L) options. More specifically, the present invention discloses either of a first variant of a multi-position rotary knob with monostable end stop functionality or, in an alternate variant a 360° rotatable knob. Additional features include the use of any of a thin film transistor (TFT), organic light emitting (OLED) or LCD segmented displays which eliminates the necessity of light pipes thereby reducing part content while providing higher quality graphics.

BACKGROUND OF THE INVENTION

The prior art is documented with examples of lighting displays for vehicle shifter assemblies. A common example of these utilize light emitting elements located on a PCB circuit board integrated into a known shifter assembly, the PCB communicated via a plurality of light pipes for tunneling individual light pathways to a dedicated painted and etched surface display which is incorporated into either of a rotating shifter knob display face or dial, or configured astride a linearly adjustable shifter lever display surface/dial.

Disadvantages of the current design include the requirement of painting/repainting or laser etching the desired shifter position designations into the lens other display covering. Other shortcomings include the attendant costs and additional part content, such as in particular for the light pipes and supporting light pipe frame for communicating the illumination from the PCBA mounted LED's to the etched surface locations (i.e. PRND).

Other examples derived from the prior art include Paulo, U.S. Pat. No. 6,568,345, which teaches a cluster display backlight source set on a PCB and which includes a microcontroller for controlling the lights and sending display information to each cluster. The clusters are mounted on a single support or frame. A rotating mechanism controlled by the driver moves the selected cluster into the line of sight of the viewing surface, which is backlighted and evenly spread by a reflector across the cluster. The light source is set on a PCB incorporating a microcontroller for controlling the lights and sending display information to each cluster.

Specks, US 2004/0207607 teaches an integrated display which is programmable. Niazi, US 2018/0143754 further teaches a flat touch-sensitive electronic screen built into the steering wheel and including a graphic user interface for controlling vehicle operations.

Other references include CN 109973640, which teaches another version of a monostable rotary knob and EP 3 225 884 (Fico) which teaches a rotary shifter with a unique cam, gearwheel and locking pawl arrangement. U.S. Pat. No. 4,378,474 (Olson) teaches a rotary switch with a unique spring and detent arrangement (see in particular FIGS. 4 and 7) for engaging notched inner circumferential notch positions 15 configured in the gear knob 24.

U.S. Pat. No. 6,781,512 (Hayashi) is directed to a vehicle graphical display apparatus, selected from CRT, flat panel, active matrix or plasma displays. U.S. Pat. No. 7,965,282 (Yamada-Honda) teaches an operation device with an operating knob for accessing subset displays via tilt switch functionality provided via a variable load mechanism for responding to any tilt angle of the knob (see FIG. 5).

U.S. Pat. No. 7,971,498 (Meyer—ZF Friedrichshafen) rotary control device in which a compression spring 7 and locking piece 6 adapted to engage outer contour locations 5 of the knob 1. U.S. Pat. No. 8,055,419 (Meng) teaches a tachometer display exhibiting multiple Archimedean spirals overlaying concentric arcs on a face plate, these indicating any of multiple shifter positions (economy, performance, racing, etc).

SUMMARY OF THE PRESENT INVENTION

The present invention discloses a rotary shifter providing each of multi-position (with monostable opposite ends) or 360 degree rotational functionality. A cylindrical shaped knob is provided with an inner circumferential surface exhibiting a detent profile and is supported around a stationary inner housing, the housing additionally supporting outwardly biased pawls establishing an interface with the detent profile in a selected rotational position. The inner housing further supports a rotating spur gear having an end secured magnet positioned above a sensor (such providing a switching component in the form of an inductive sensor in which relative motion of the overhead magnet results in a change of voltage), the sensor being incorporated into a printed circuit board configured at a base location of the housing. Rotation of the knob signals to the sensor to in turn instruct a microprocessor or microcontroller component associated with the PCBA to instruct switching to designate a given shifter position (PRND S/M/L) or drive mode selection. The knob also includes an illuminating surface (TFT/OLED, segmented, etc.) for presenting menu options for indicating such as shifter position or drive mode selection.

In a first variant, a planetary gear configuration is provided within the inner housing for supporting the rotating spur gear which, in combination with the outwardly biased and inner detent interfacing pawls, provide for rotation of the knob across multiple fixed intermediate positions, in combination with opposite end located and monostable selected positions. The selector switch incorporates a surface graphical display (thin film transistor, segmented, etc.) and which, in addition to designating various modes or shifter positions, further serves (upon knob rotation beyond a monostable end position) to provide the user the ability to toggle a sub-menu of options, such as for refinement or fine tuning of custom drive modes.

A further variant teaches a redesign of the rotary knob so as to function in either of multi-position with monostable end functionality (as described in the initial embodiment) or in a fully 360° rotational range. A base location of the inner housing is redesigned to support a ring gear rotatably operating the spur gear with end magnet positioned over the PCBA and sensor/switching component. A rotatable knob portion or handle includes upper and lower components which support the surface graphical display. An outer housing positions and supports the rotational knob relative to the stationary inner housing. The detent profile configured upon the lower rotatable knob or handle can further be designed to permit the handle to be rotated a full 360° without end stops. Alternatively, and as in the first variant, the knob can define a designed number of individual positions, with first and last positions represented at angular offset positions less than 360°, and which can further incorporate angled profiles such that only limited mono-stable rotation is permitted, such as for toggling through sub-set menu options.

BRIEF DESCRIPTION OF THE DRAWINGS

Reference will now be made to the attached drawings, when read in combination with the followed detailed descriptions, wherein like reference numerals refer to like parts throughout the several views, and in which.

DETAILED DESCRIPTION OF THE PREFERRED EMBODIMENTS

Figure 3:
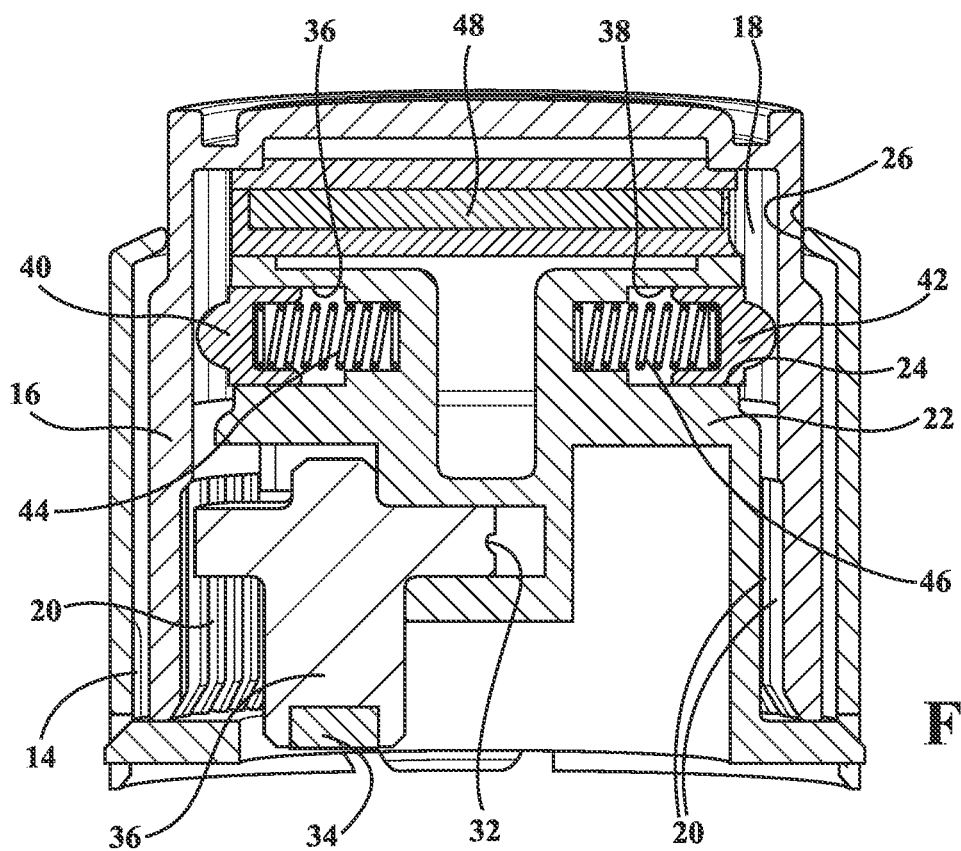
FIG. 3 is a cutaway taken along line 3-3 of FIG. 2 and showing the inner-workings of the rotary selector switch including the spring and pawl interface with the detent profile configured within the planetary gear and detent component in combination with the rotary spur gear with end supported magnet and which, upon being rotatably actuated by the planetary gear, causing the magnet to rotate relative to a PCBA mounted sensor to indicate shifter position and menu options presented by the graphical display.

With reference to the attached illustrations, the present invention discloses a rotary vehicle drive mode or shift position selector knob (hereinafter synonymously referred to as a rotary selector switch), shown at 10 in each of FIGS. 1 and 3, according to a first variant. The rotary selector knob or switch incorporates a planetary gear and magnet supporting rotating spur gear arranged in proximity to a shifter position determining printed circuit board (PCBA). In combination, an arrangement of outwardly biased springs and pawls provide an opposing interface with a detent profile configured circumferentially within an inner surface of the planetary gear body, such that rotation of the knob achieves multiple fixed positions in combination with opposite end monostable select positions. As will be further described in additional detail, the drive mode switch incorporates a surface graphical display (thin film transistor, segmented, etc.) which, upon knob rotation beyond a monostable end position, provides the user the ability to toggle a sub-menu of options, such as for refinement or fine tuning of custom drive modes.

According to non-limiting applications of the present invention, the rotary knob allows the vehicle operator to select various shifter positions (PRND S/M/L) or drive modes, such as in one non-limiting application for presenting any of Sport, Snow, Economy (ECO) or other modes. The rotary knob further provides a graphic display not limited to thin film transistor, OLED or segmented display for indicating the shifter position or drive mode selection.

Figure 1A:
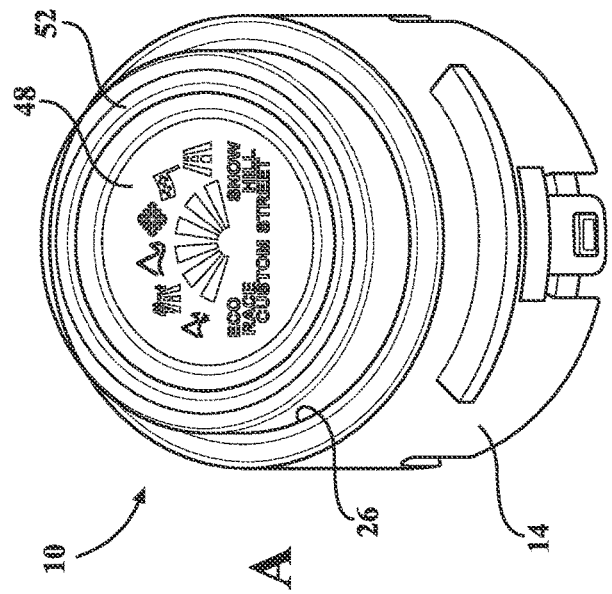
FIG. 1A is an assembled view of a rotary selector knob according to a first embodiment of the present invention.
Figure 1B:
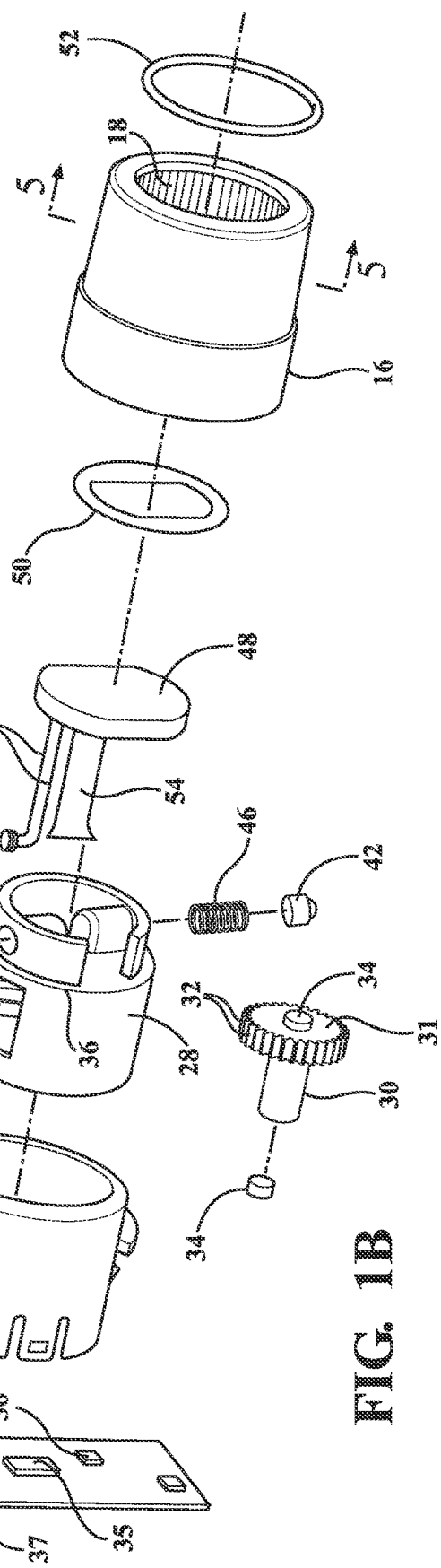
FIG. 1B is an exploded view of the rotary selector knob of FIG. 1A and illustrating the PCBA supported cylindrical bottom cover and inner housing with outwardly biased spring and pawl components, the cylindrical knob or handle being rotatably supported through the fixed shifter positions in combination with a graphical display not limited to thin film transistor or segmented designs.

With reference initially to FIGS. 1A and 1B, both assembled perspective and exploded views are provided of selected components associated with the rotary selector knob 10 according to the first embodiment of the present invention and illustrating a printed circuit board (PCBA) 12 supporting a cylindrical bottom cover 14. For purposes of ease of illustration, certain housing and fascia components, including such as which encases the lower PCBA 12 and supports the bottom cover 14, are not shown.

Figure 3A:
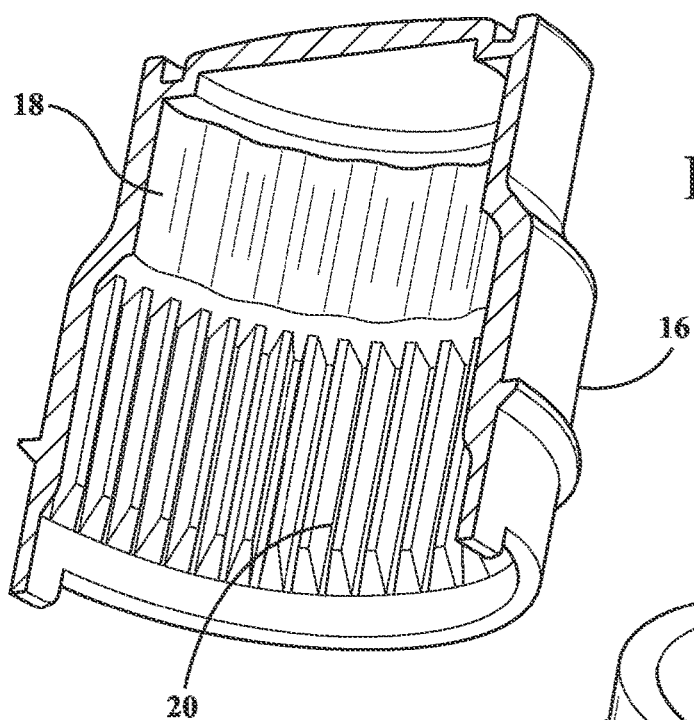
FIG. 3A is a sectional cutaway of the detent profile and planetary gear configured within the cylindrical shaped handle component.
Figure 3B:
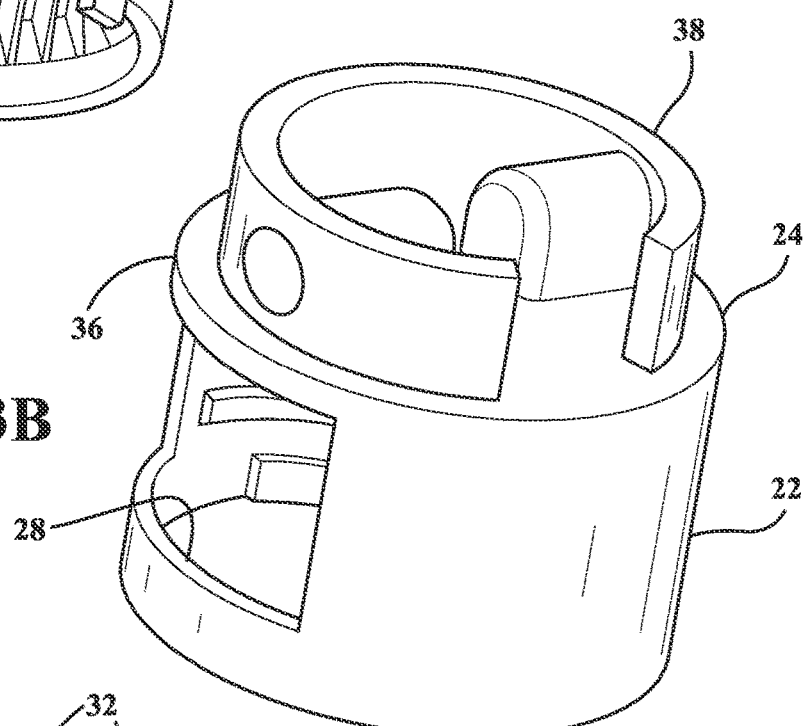
FIG. 3B is a sectional perspective of the package support inner housing component positioned coaxially internally of the handle component and supporting the opposing pairs of detent interfacing springs and pawls in combination with supporting the spur gear in relation to the inside circumferentially arrayed teeth configured within the planetary gear component.
Figure 3C:
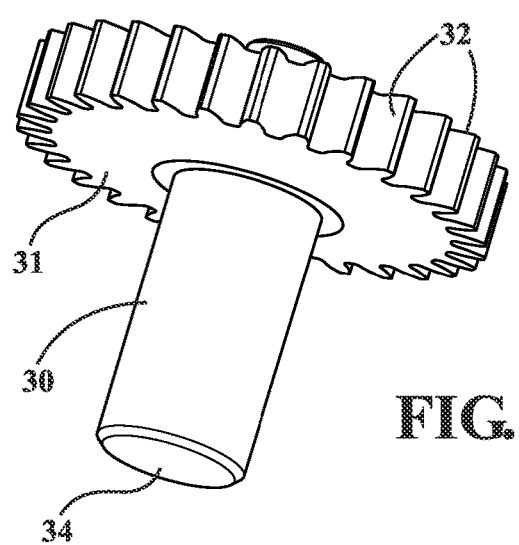
FIG. 3C is a sectional perspective of the spur gear with end supported magnet.

Additional components include a generally cylindrical shaped knob 16 (also termed a handle component and with further reference to FIG. 3A having an inner circumferential surface defining an open interior and exhibiting an upper detent profile 18 and a lower planetary gear profile 20). A stationary inner housing 22 is positioned within an open interior of the knob (see FIG. 3). As best shown in FIG. 3B the inner housing includes a generally cylindrical shape with a stepped interface defined by an annular ledge 24 which corresponds with location of an installed inner annular edge profile 26 of the outer and bottom cover 14.

Also shown is an interior window defined by an inner rim 28 configured in the inner housing 22 and which, as will be further described, provides support for a radially projecting spur gear having a shaft 30 supporting an uppermost enlarged diameter end 31 depicting a plurality of circumferentially arranged teeth 32, with selected teeth being in engagement with the inside facing circumferential teeth 20 of the lower planetary gear profile. In combination, a shaft end face of the spur gear diameter end 31 incorporates a magnet 34, with eccentric/orbital rotation and planetary displacement of the spur gear occurring in proximity to a sensor 36 located in the PCBA 12. The sensor 36 without limitation can include an inductive sensor which, upon sensing a change in position of the overhead spur gear supported magnet, senses a change in voltage, a representative output signal of which is fed to a microprocessor component 35 of the PCBA 12 to in turn instruct a change in either a shift position or drive mode in a signal outputted from the PCBA 12. Also depicted on a rear side of the PCBA 12 is a connector 37 for connecting the separate wire harness.

The inner housing 22 includes a pair of radially directed pockets 36 and 38 configured in upper locations thereof. A pair of pawls 40 and 42 are supported within the pockets 36/38 with outwardly biased by coil springs 44 and 46 arranged underneath in the pockets and as best shown in FIG. 3. The pawls 40/42 respectively bias against selected detent profiles 18 of the outer knob or handle 16 (see again FIG. 3) in order to define selected rotary adjusted positions of the knob 16 relative to the coaxially supported inner housing 22 as well as the outermost bottom cover 14.

An illuminating component 48 (such as further described including of a thin-film transistor, organic light emitting diode (OLED) or segmented display options, is associated with a surface display of the rotatable shifter knob or handle 16 for displaying a selected drive mode. Other features of the assembly include finish assembly components including a closeout 50 and outermost finish (such as chrome) ring 52 as shown in FIG. 1.

The graphical display assembly 48 and associated applications provide a variety of display variants for adapting the surface dial illumination (see subsequent FIGS. 6-6F) associated with any configuration of shifter display to provide for any non-limiting depictions to accurately and effectively indicate any shifter/mode position. The improved display can incorporate any of thin film display (TFT), transistor LCD, or organic LED (OLED) display variants and which allows for any representation not limited to color, pattern or intensity to be created within a display surface geometry (again such as not limited to either of a round display in a rotary selector or a rectangular display associated with a linear gate selector). The present invention further allows for the use of a clear display surface (not having any painting or etching associated with known selector or other mode position indications and which is only limited by operating software communicated from the associated PCBA circuit board 12 and associated microcontroller.

Although not illustrated, an interior of the display housing 48 display housing can incorporate a plurality of LED or suitable illuminating components along with an LCD panel or the like. A ribbon harness 54 can provide either integrated power lines in a first TFT/OLED configuration or can include a pair of separate wires 55 and end connector 56 (see again FIG. 1B) in a segmented variant extending from the surface display housing connects to the PCBA 12, with the surface display in one variant being generically provided without any specific etched or painted representations and which is modifiable in both color and intensity based upon the inputs received from the PCBA 12 to achieve a desired illumination scheme.

An alternate variant provides a segmented display in which the harness is substituted by a ribbon (not shown) extending from the PCBA 12 to a suitably reconfigured LED or LCD enabled display surface and by which individual wires within the ribbon illuminate are communicated to selected segments of the display surface. In this manner, and based upon the collection of individual inputs communicated from the main microcontroller located on the PCBA 12, a desired illumination scheme is achieved.

Additional features include the programmed surface display (such as associated with OLED/TFT variants) depicting a current selected mode or sub-menu selection by the graphical display. The main microcontroller 35 of the PCBA board 12 may include a serial communication protocol not limited to any of LIN, SPI, and 12C. Other features include the PCBA board 12 microcontroller 35 incorporating a serial communication protocol not limited to any parallel interface established between the main microcontroller 35 and the display surface of the graphic display 48.

Figure 2:
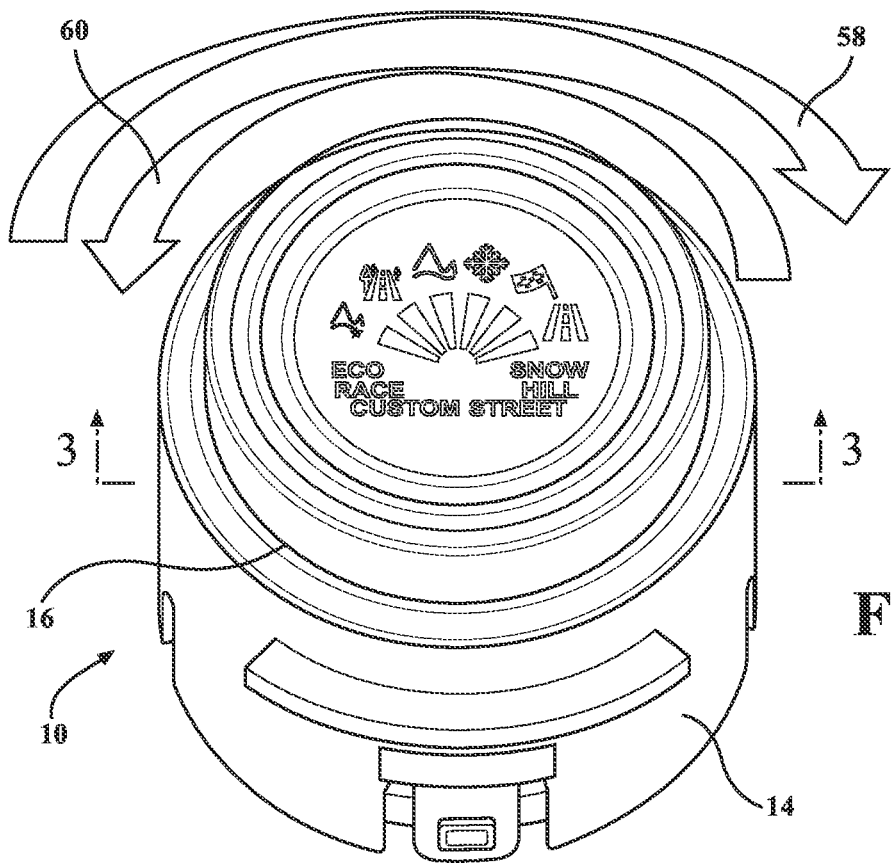
FIG. 2 is a repeat of the rotary selector switch of FIG. 1A and further showing the range of rotational fixed positions.
Figure 4:
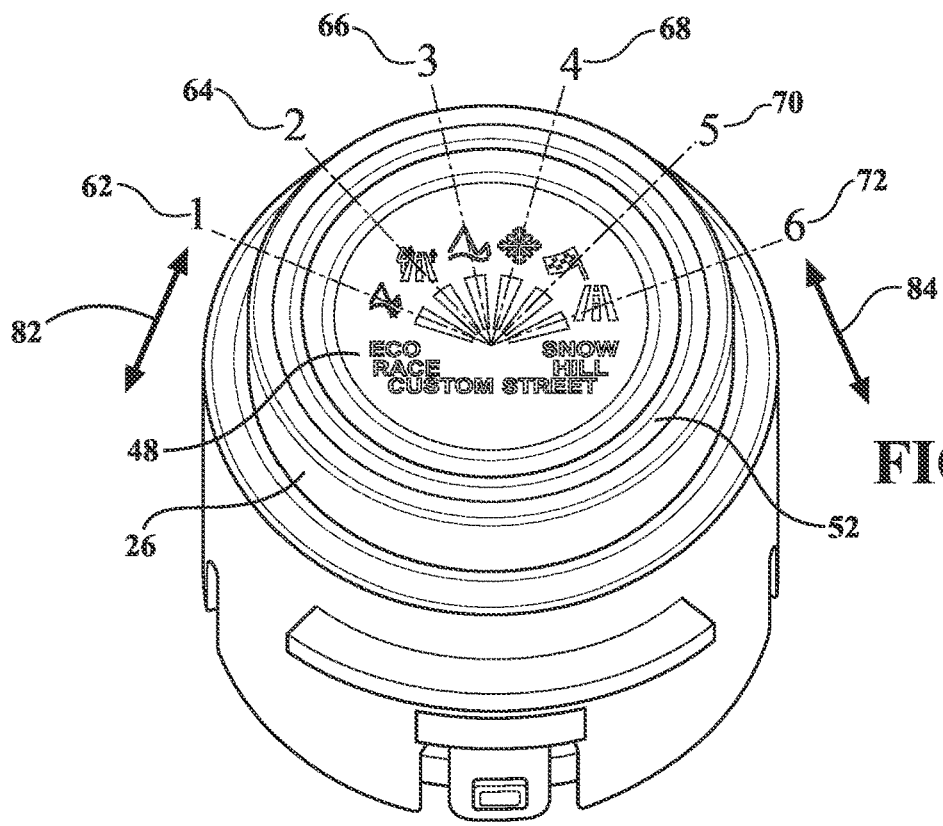
FIG. 4 is an illustration similar to that presented in FIG. 2 and depicting each of first, second, third, fourth, fifth and sixth fixed rotary select positions established by rotation of the cylindrical handle relative to the outwardly biasing pawls supported by the inner coaxially arranged and stationary package housing component, as well as further showing opposite end positions which, upon monostable toggled actuation, provide additional sub-menu functionality.

Given the above structural description, FIG. 2 is an assembled perspective of the rotary selector switch of FIGS. 1A and 1B and further showing the range of rotational fixed positions which are accessible via either of clockwise (arrow 58) or counter-clockwise (arrow 60) rotating motion of the knob 16 applied by the user. FIG. 4 is an illustration similar to that presented in FIG. 2 and depicting each of first 62, second 64, third 66, fourth 68, fifth 70 and sixth 72 rotary shifter positions established by rotation of the cylindrical knob/handle 16 relative to the outwardly biasing pawls 40/42.

As will be further described, the opposite first 62 and sixth 72 end positions, upon monostable toggled actuation, provide additional sub-menu functionality. Specifically, and with reference to FIG. 5, a plan view taken along line 5-5 of the planetary gear and detent component 16 of FIG. 1B is shown and illustrates angled end profiles associated with the detents 18 at opposite end positions for supporting monostable functionality (it is further noted that the lower planetary gear teeth 20 are hidden in downwardly looking plan cutaway view of FIG. 5 and owing to them being arranged in an outwardly diameter spaced fashion as noted in FIG. 3A and relative to the upper and inwardly diameter arranged detent profile teeth 18).

Figure 5:
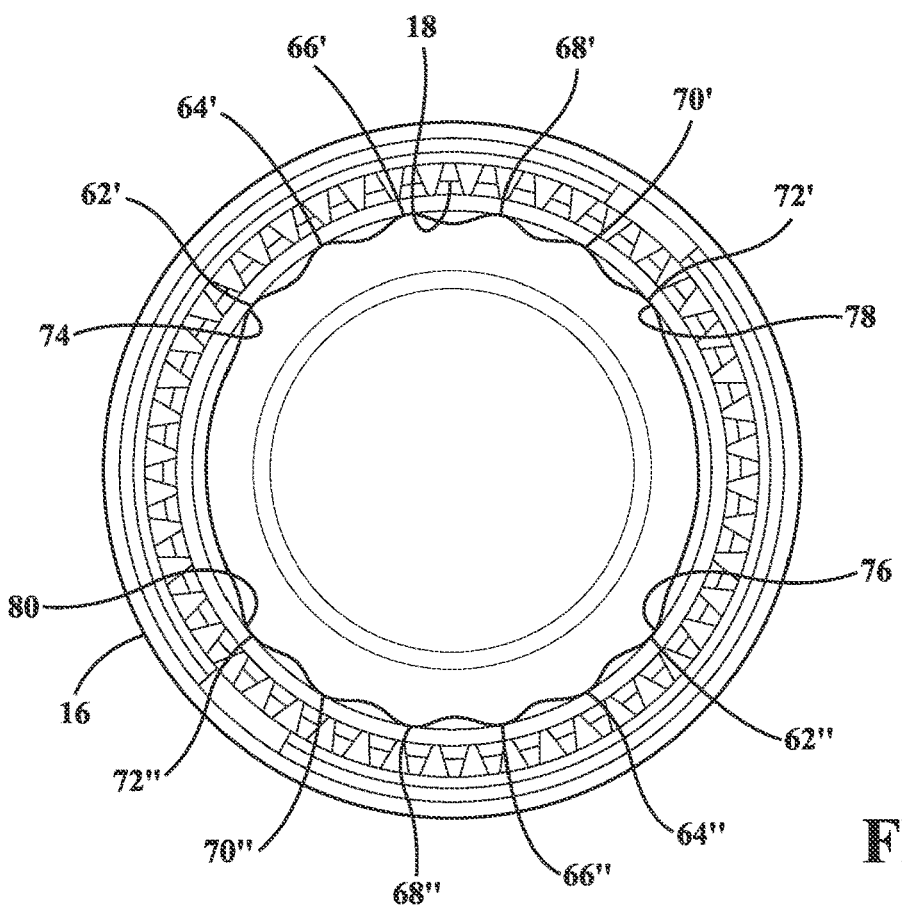
FIG. 5 is a plan view taken along line 5-5 of the planetary gear and detent component of FIG. 1B and illustrating angled end profiles associated with detents at opposite end positions for supporting monostable functionality.

FIG. 5 further depicts one hundred and eighty degree offset pairs of inner circumferential rim locations corresponding to positions one through six and are depicted by offset rim locations 62'/62" for first end position 62, locations 64'/64" for second position 64, locations 66'/66" for third position 66, locations 68'/68" for fourth position 68, locations 70'/70" for fifth position 70 and locations 72'/72" for sixth position 72. As is further shown, ends of the first position offset rim locations 62'/62" and sixth position offset rim locations 72'/72" are angled (see as further shown by angled depictions at 74/76 for first position locations 62'/62" as well as at 78/80 for sixth position locations 72'/72".

The configuration and arrangement of the angling portions 74/76 and 78/80 at the first 62 and sixth 72 locations can be provided in combination with a suitable rotational biasing component (such as provided by the biasing springs 44/46 associated with the outwardly biased pawls 40/42 but which is envisioned in alternate variants to also include any torsional spring or like structure not shown) and so that toggling outside of the first 62 and sixth 74 positions define monostable adjustment positions. This is further represented by either of consecutive counterclockwise rotary motion at the first position 62 (see at 82 in FIG. 4) or clockwise rotary motion at the sixth position (further at 84) applied to the knob 16 and resulting in controlled monostable adjustment (such as in combination with the associated counter biasing spring components such as integrated into the biased pawls) and which results in further rotation of the spur gear supported end magnet 34, again via the teethed engagement of the pawls 40/42 to the succeeding interior circumferential detent profile 18 locations of the knob 16.

The angling of the detent ends at the first 62 and sixth 72 positions is such that succeeding rotation of the knob 14 beyond the monostable end positions in turn causes the lower planetary gear teeth 20 of the knob/handle 16 to in turn incrementally rotate the supported spur gear 30 (see again FIG. 3), via the meshing arrangement established between the knob inner gear teeth 20 which act upon the spur gear teeth 32, and so that this incremental rotation of the end face magnet 34 is read by the PCBA 12, via its sensor 36 and communicating microcontroller 35.

Figure 6:
FIG. 6 presents a non-limiting graphical depiction of the display component of the rotary selector knob along with a combined presentation of menu options.

Proceeding to FIG. 6, presented is a non-limiting graphical depiction of the display component of the rotary selector knob (such as presented upon a display face associated with the display component 48 and according to the graphical display options previously described). The graphical depiction of FIG. 6 also provides a non-limiting overall depiction with a combined presentation of menu options showing color coded mode positions (again first through sixth by non-limiting representation) along with corresponding textual and color coded representations for each mode position.

Figure 6A:
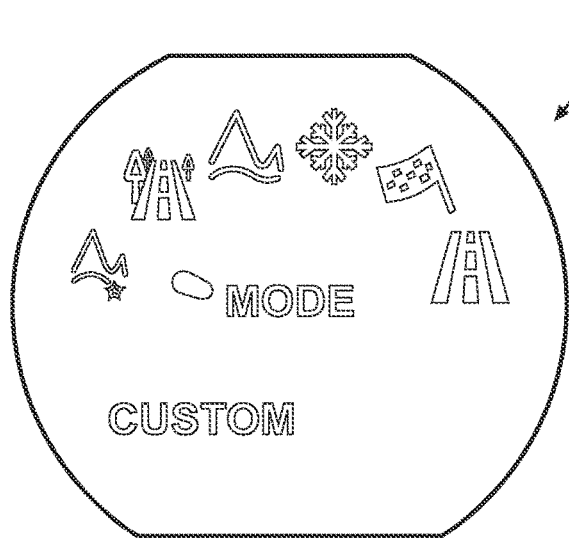
FIGS. 6A-6F are subset illustrations respectively of a first through sixth position modes taken from the menu options of FIG. 6.
Figure 6B:
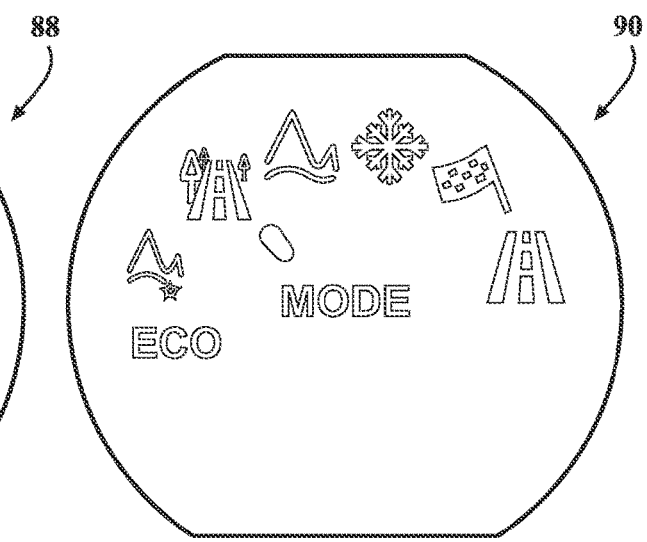
Figure 6C:
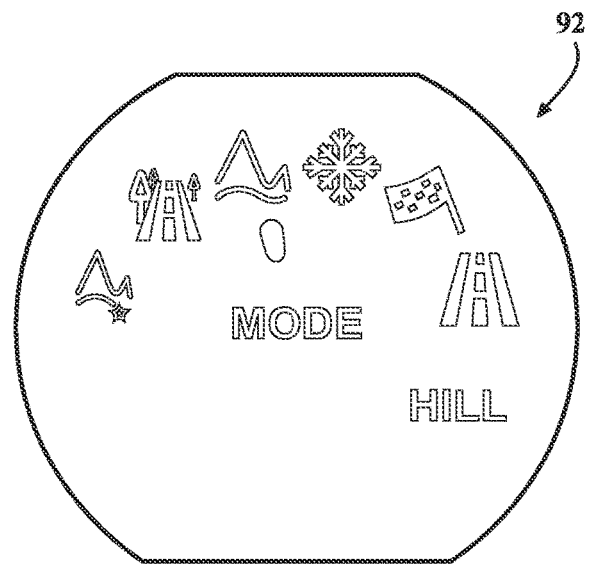
Figure 6D:
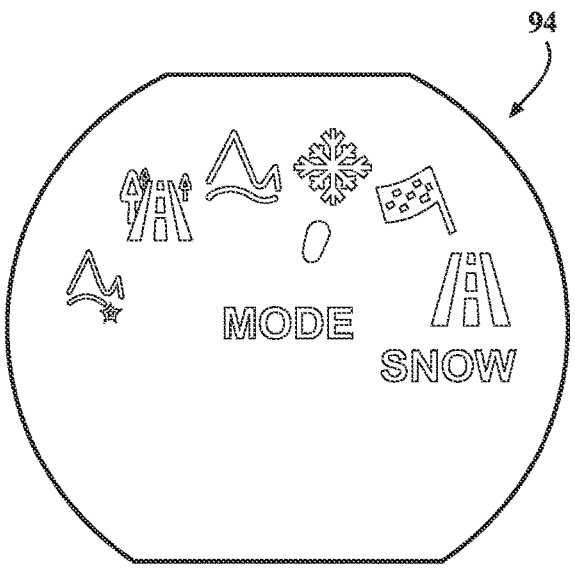
Figure 6E:
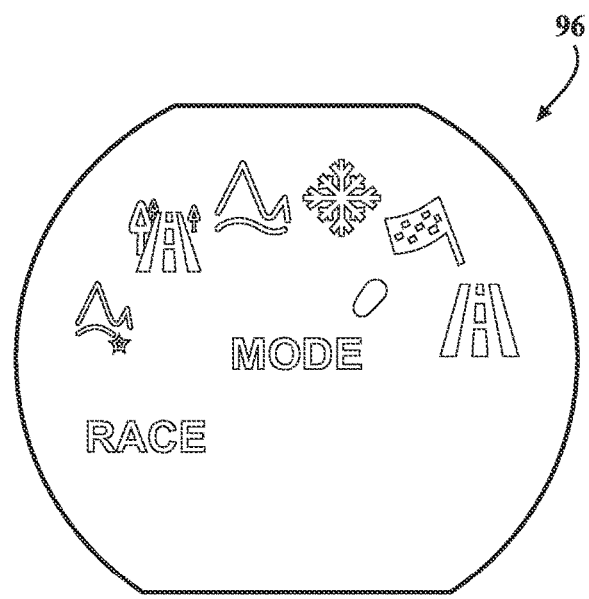
Figure 6F:
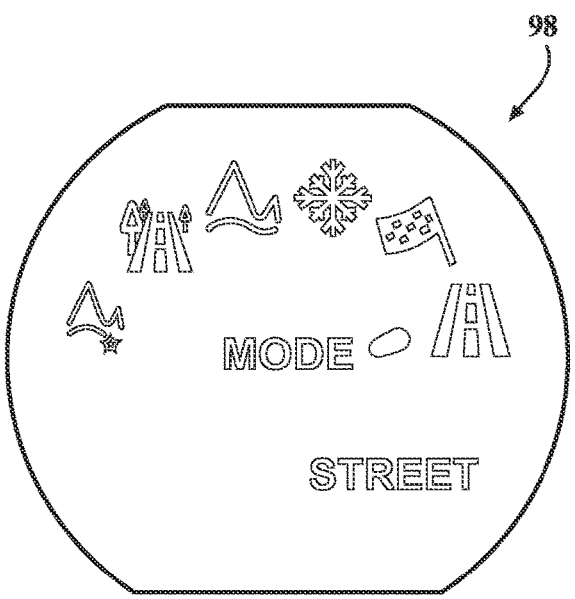

The non-limiting graphical depictions provided in FIG. 6 (all illuminated) include for each of first monostable position for CUSTOM (see also at 88 in FIG. 6A), second fixed position for ECO (for Economy and as shown at 90 in FIG. 6B), third fixed position for HILL (see also at 92 in FIG. 6C), fourth fixed position SNOW (see also at 94 in FIG. 6D), fifth fixed position RACE (see also at 96 in FIG. 6E), and, finally, sixth monostable position for STREET.

As again depicted at 88-98 respectively for each of FIGS. 6A-6F, the subset illustrations presented are of one non-limiting combination first through sixth position modes taken from the menu options of FIG. 6. As previously described consecutive toggled counter clockwise (CCW) motion 60 beyond the first monostable position 62 or clockwise (CW) motion 58 beyond the sixth monostable position 72 results in a sub-menu of selections for either or both of the CUSTOM and STREET modes shown in FIGS. 6A and 6F respectively.

The monostable positions 62 and 72 offer the user the ability to not only select a drive mode, but also to utilize the monostable positions to allow the user to toggle and sub-menu for custom modes, using the same rotary knob 16. In this manner, the present invention provides the user with a single switch or knob for making any desired sub-menu selections (not shown) additional to the primary mode selections 62-72.

Additional variants envision substituting the gearing components described herein with a magnet ring and sensor arrangement incorporating into the PCBA.

Figure 7:
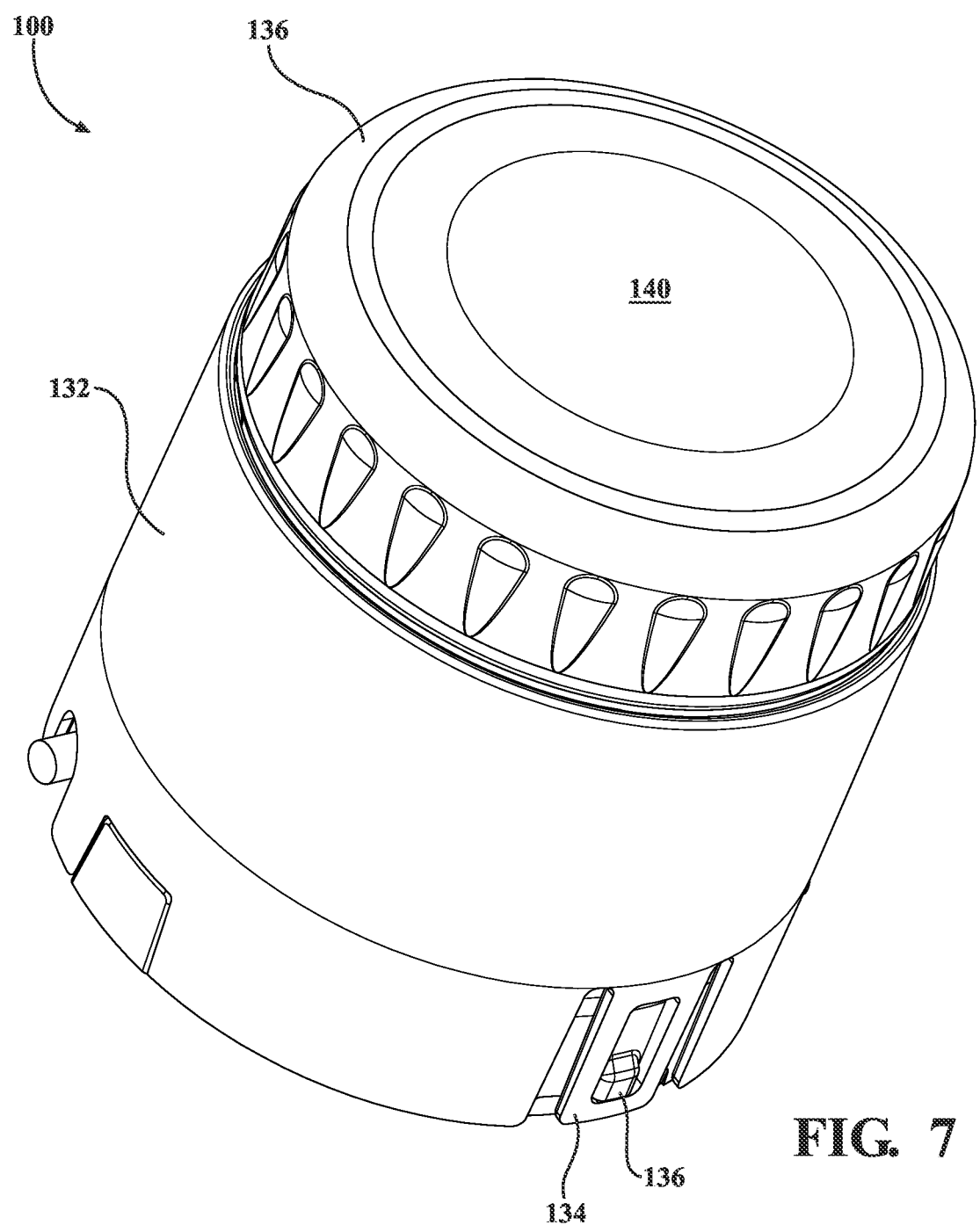
FIG. 7 is an assembled perspective of a rotary selector switch according to a further embodiment.

Referring now to FIG. 7, an assembled perspective is generally shown at 100 of a rotary selector switch according to a further embodiment. As will be described with reference to the succeeding views, the rotary knob can be provided in either of a multiple fixed position configuration with monostable end functionality (similar to FIGS. 1-6), such as for a drive mode variant in which the end monostable functionality provides the ability to toggle through a subset menu of custom drive modes. In a further reconfiguration, the rotary knob or switch can be provides as a 360° rotary shifter knob such as for presenting various shifter positions PRND S/M/L. Without limitation, the rotary selection knob or switch allows the vehicle operator to select from various drive/terrain modes, such as sport, snow, economy (ECO), etc., or to be used as a gear shift selector (Park, Reverse, Neutral, Drive, Manual/Sport).

Figure 8:
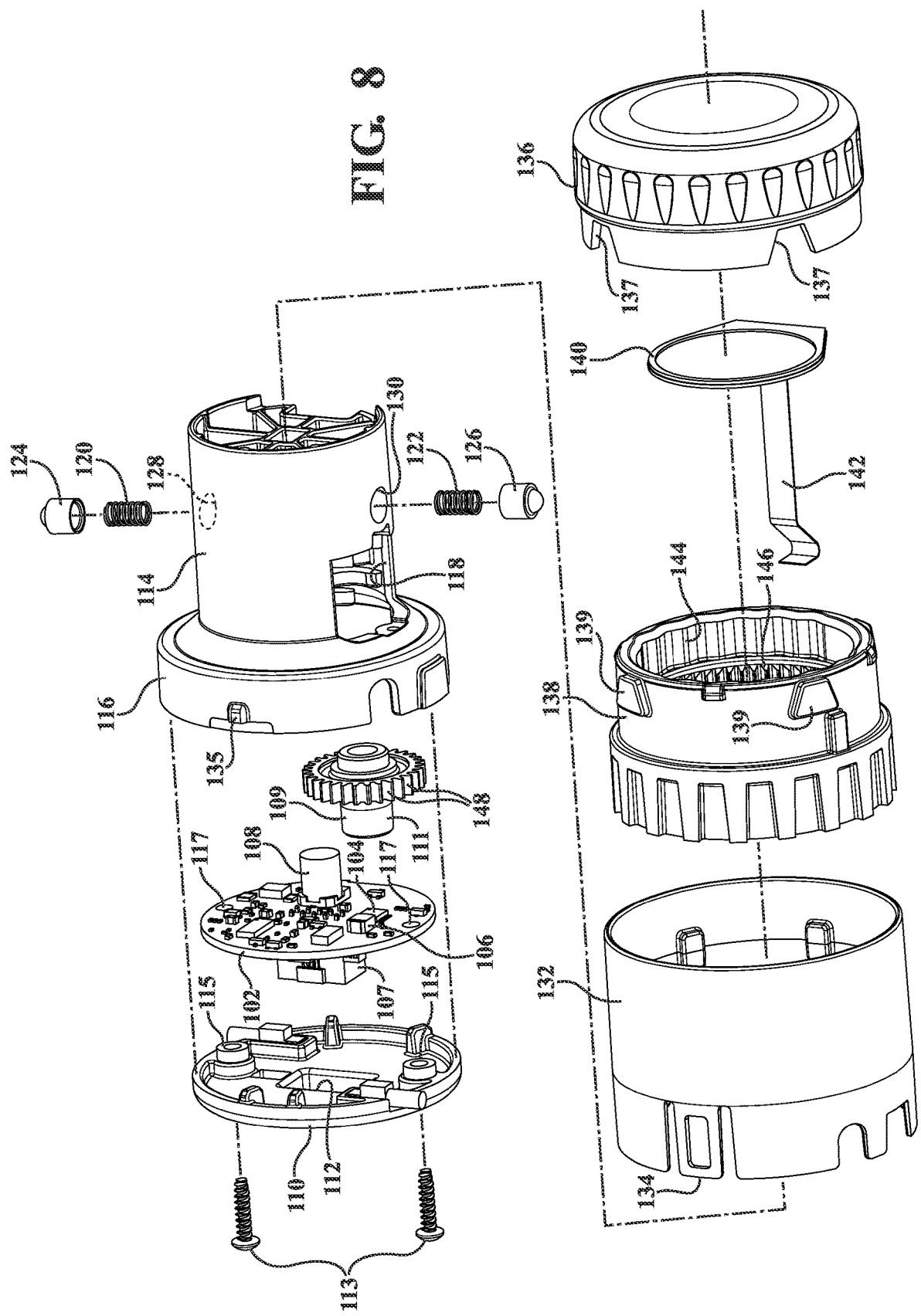
FIG. 8 is an exploded view of a rotary selector knob similar to that shown in FIG. 7 and illustrating a redesigned PCBA supported by a bottom cover, inner housing with outwardly biased spring and pawl components, and outer cylindrical housing which supports upper and lower handle components rotatably supported through the fixed shifter positions in combination with a graphical display not limited to thin film transistor or segmented designs.

FIG. 8 is an exploded view of a rotary selector knob similar to that shown in FIG. 7 and illustrating a redesigned printed circuit board assembly (PCBA) 102, this being shown in a generally circular disk configuration and which includes an arrangement of upper surface components. This includes at least a sensor component 104 on an upper face, as well as a microcontroller or microprocessor component 106. Also depicted is a wire harness connector 107 of a rear surface of the PCBA 102, as well as a further upwardly projecting capacitor 108. The PCBA 102 also includes, without limitation, a power supply or other component.

The spur gear 109 is arranged in overhead proximity to the sensor component 104, which is typically in the form of an inductive sensor. The spur gear 109 includes an end face magnet 111 opposing the inductive sensor 104, with relative orbital motion of the spur gear (such as relative to a ring gear incorporated into the rotatable knob as will be described) resulting in a relative change in position of the magnet, with a voltage change then being read by the sensor 104 for communicating to the microcontroller/microprocessor component 106.

A bottom cover 110 is provided having a similar cross sectional disk shape and is configured to receive the PCBA 102 in a seating arrangement (including the provision of a recess pocket 112 for seating the microcontroller 106). Mounting screws 113 seat through apertures 115 in the bottom cover 110 and aligning mounting apertures 117 in the PCBA 102.

An inner housing has a cylindrical shaped body 114 and is provided with an outwardly flared lower rim 116. A window (see inner rim 118) is configured within the inner housing for seating the spur gear. First and second pairs of outwardly biased spring (120 and 122) and pawl (124 and 126) components are provided and are supported within apertures 128 and 130. The spring and pawl components function similar as described in FIG. 1B at 40-46 as will be further described with reference to FIGS. 9 and 10.

An outer cylindrical shaped housing 132 installs over the inner housing and includes bottom tabs 134 with aperture receiving locations which engage projecting portions 135 configured at the lower expanded rim end of the inner housing 116 for securing the outer housing to the inner housing. Upper 136 and lower 138 interconnecting handle or knob components are provided, these further defined as one or more rotatable portions, with the lower handle or knob component 138 seating within the outer housing 132 as shown in FIG. 7. An underside rim of the upper handle or knob portion 136 includes notches 137 which seat within outer protuberances 139 formed about an upper rim of the lower handle component 138 and so that the upper and lower handle components rotate together.

A graphical display surface 140 (not limited to thin film transistor, OLED or segmented designs) seats within the upper handle component 136 so that the display is visible through a top surface. The graphical display can also include a ribbon cable 142 which extends to the remote bottom end located PCBA 102. Without limitation, the ribbon cable forms part of a wire harness which can include power lines in a TFT/OLED variant, the power lines being separated into a separate wire set in the instance of a segmented variant.

The lower handle 138 further includes an upper inner circumferential array of detents 144 (similar to as shown in FIG. 3A at 18), as well as a corresponding lower array of teeth 146 corresponding to a circumferential interior ring gear for inter engaging selected outwardly facing teeth 148 of the spur gear 109. Without limitation, the knob can be provided as either of a one-piece construction in which the detents and gear profile are integrated therein (such as also shown in FIG. 3A). Alternatively, the knob can be provided as a two piece subassembly in which the upper portion 136 can be removed from the lower portion 138, such as in order to access the underside display 140 and ribbon cable 142.

Figure 9:
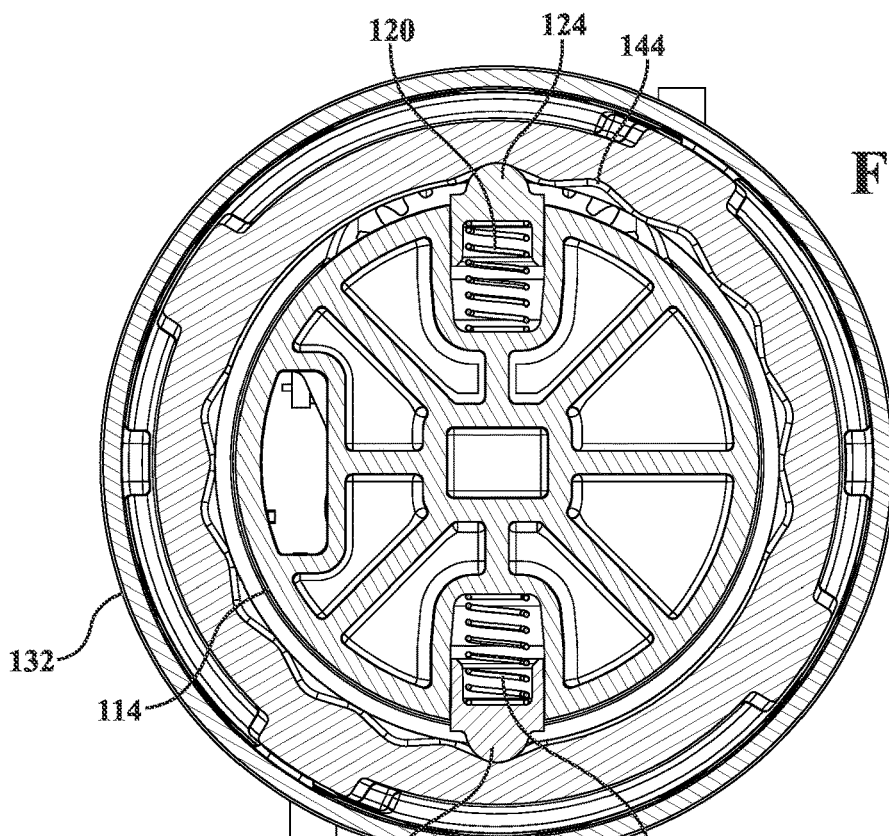
FIG. 9 is a cross-sectional cutaway of a first version of an assembled rotary selector knob such as depicted in FIG. 7 in which the rotary handle rotates three hundred and sixty degrees with no end stops configured between the outwardly spring-loaded pawls and opposing detent profiles configured within the interior of the lower handle component.

FIG. 9 is a cross-sectional cutaway of a first version of an assembled rotary selector knob such as depicted in FIG. 7 in which the rotary handle rotates three hundred and sixty degrees with no end stops configured between the outwardly spring-loaded pawls 124/126 and opposing detent profile 144 configured within the interior of the lower handle component. Also shown is a ribbon/LED wire harness tunnel 145 for communicating the display 140 to the PCBA 102.

Figure 10:
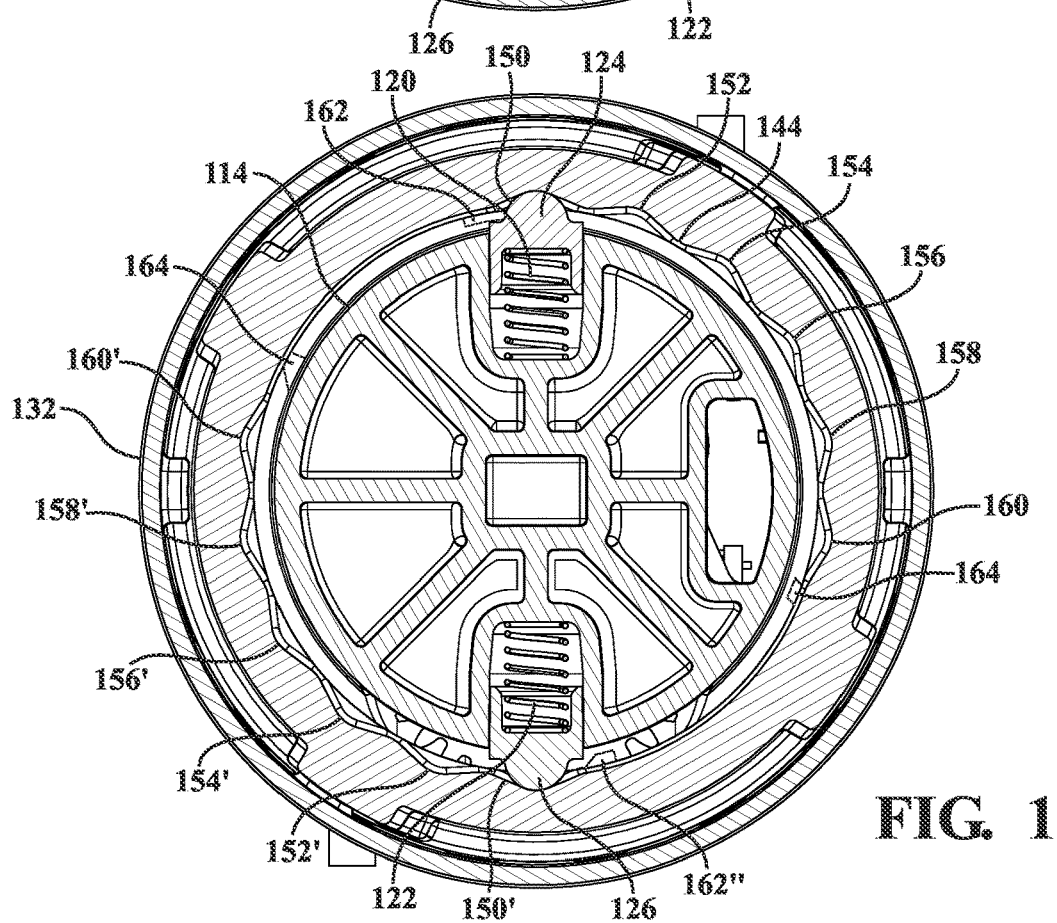
FIG. 10 is a similar illustration to FIG. 9 of a second version of the rotary selector knob in which the knob is rotatable between a successive number of positions, with monostable end stop functionality such as in order to toggle through a sub-menu of options.

FIG. 10 is a similar illustration to FIG. 9 of a second version of the rotary selector knob in which the knob is rotatable between successive positions, with monostable end stop functionality such as in order to toggle through a sub-menu of options. Similar to as shown in FIG. 5 of the first variant, the knob positions are depicted at one hundred and eight degree offset locations 150/150', 152/152', 154/154', 156/156', 158/158' and 160/160' such that the rounded outer most biased portions of the pawls 124/126 concurrently seat within a selected pair of recessed seating locations associated with each shifter or drive mode position. As further shown, the end locations of each of the first position 150/150' and sixth position 160/160' detents further includes angled locations which are shown at 162/162' for the first position and 164/164' for the sixth position. As with the preceding embodiment of FIGS. 1-5, the monostable ends provide additional toggling functionality for navigating sub-menu options such as without limitation for presenting custom drive mode selections for presenting on the display screen 140.

Figure 11:
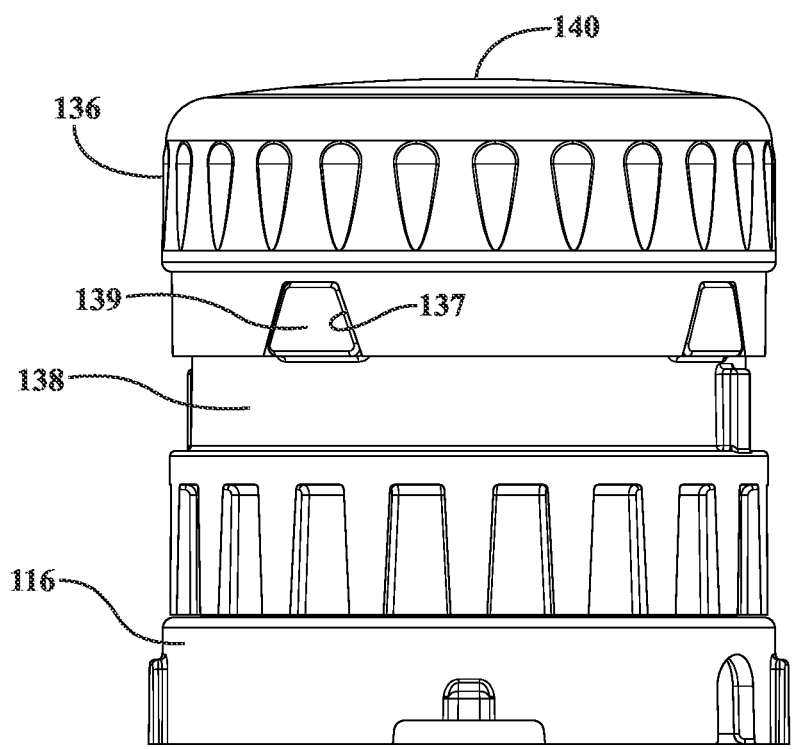
FIG. 11 is an assembled side plan view of the rotary selector knob as substantially shown in FIG. 8 with the outer housing removed and depicting the upper and lower rotatable handles supported upon the inner housing.

FIG. 11 is an assembled side plan view of the rotary selector knob as substantially shown in FIG. 8, with the outer housing removed and depicting the upper 136 and lower 136 rotatable handle components supported upon the outer lower rim support 116 of the inner housing. For purposes of the present description, the knob or handle components can be generally referred to as rotatable portions and can include a single or pair of portions as further described below.

Figure 12:
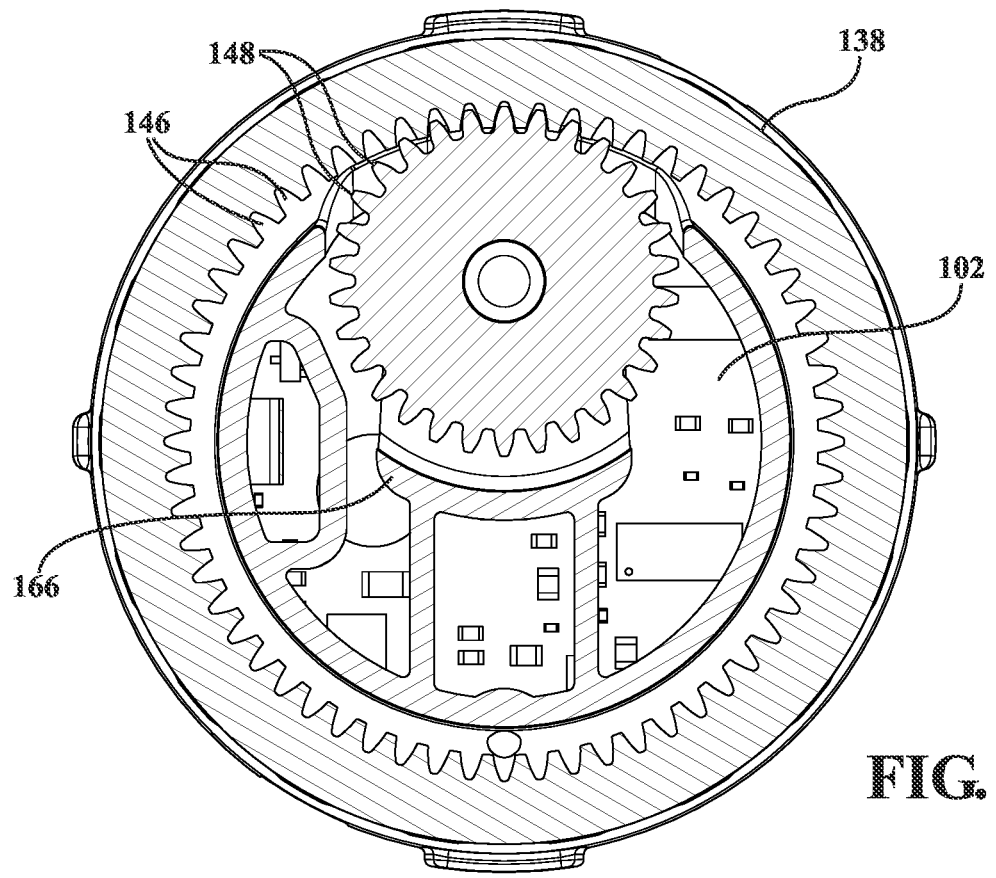
FIG. 12 is a cross section cutaway taken along the lower knob component and showing the inner supported ring gear which interfaces with and rotates the spur gear and end supported magnet positioned above the PCB mounted sensor.

Proceeding to FIG. 12, a section cutaway view is shown taken through the lower handle portion 138 (with the outer housing again removed) and showing the inner supported ring gear 146 which interfaces with and rotates the spur gear 109 and end supported magnet 111 positioned above the PCB mounted sensor 104 (see again exploded view of FIG. 8). The shaft of the spur gear (again at 109) is supported within the inner housing 114 such that the enlarged diameter head and outward teeth 148 are partially seated in projecting fashion through the window 118 and in order to meshingly engage the ring gear teeth 146 in the manner shown. Rotation of the upper and lower handle components 136/138 results in ring gear 146 rotating the spur gear 109 (via the inter-meshing teeth 148) to in turn rotate the end supported magnet 111 relative to the PCBA supported sensor 104 which in turn detects the change in position of the magnet for subsequent outputting as a signal to the microcontroller component 106.

Figure 13:
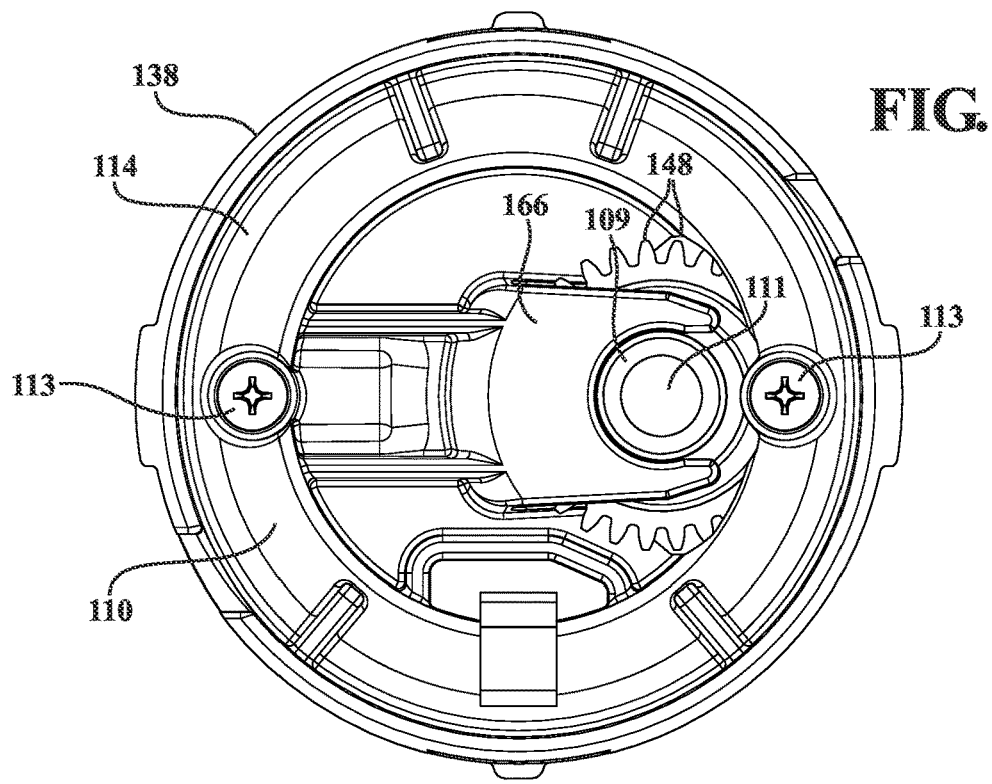
FIG. 13 is a further sectional cutaway taken along the inner housing at a lower location in comparison to FIG. 12 and again depicting the spur gear and magnet relative to the printed circuit board (PCBA)
Figure 14:
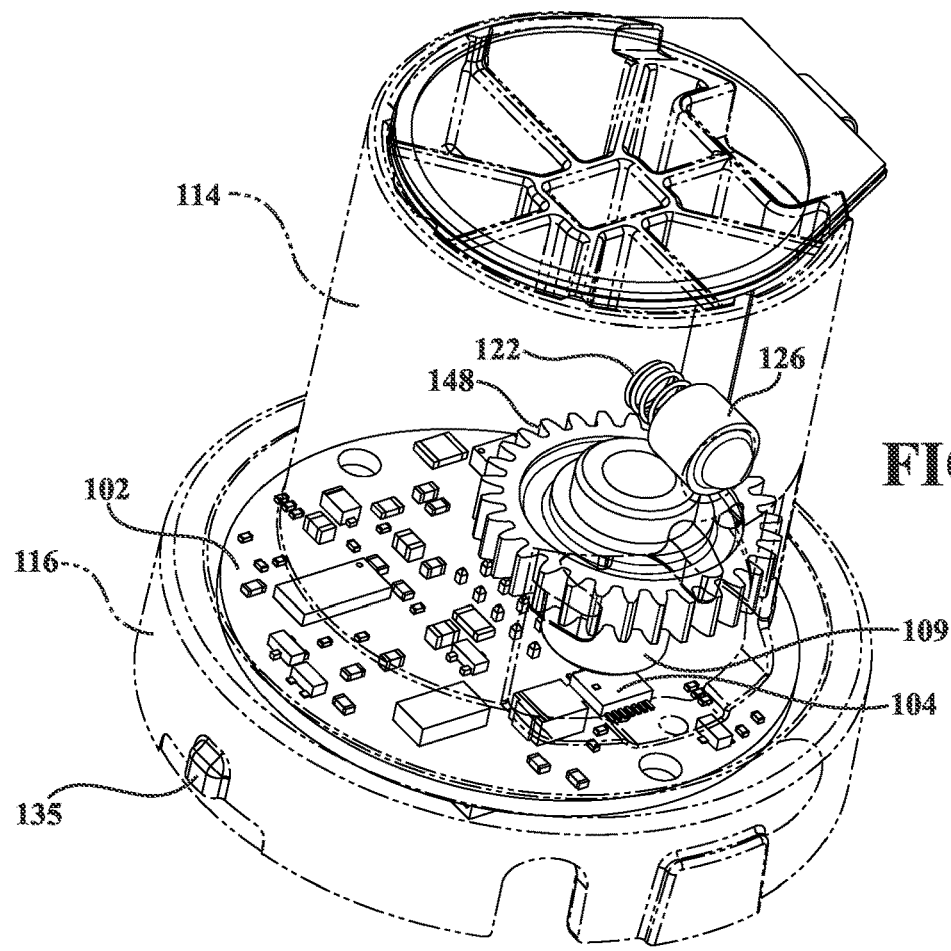
FIG. 14 is a sectional perspective view showing the inner housing in phantom and illustrating the spur gear with end supported magnet positioned above the PCBA sensor.

FIG. 13 is a further sectional cutaway underside view taken along the lower knob component 138 at a lower location in comparison to FIG. 12 in closer proximity to the PCBA 102 (not shown and again depicting the spur gear 109 and magnet 111. Also depicted is a support structure 166 associated with the inner housing 114 for supporting in a stationary rotational fashion the stem 109 of the spur gear. FIG. 14 is a sectional perspective view showing the inner housing 114 in phantom and illustrating the spur gear 109 with end supported magnet 111 positioned above the PCBA supported sensor 104.

Figure 15:
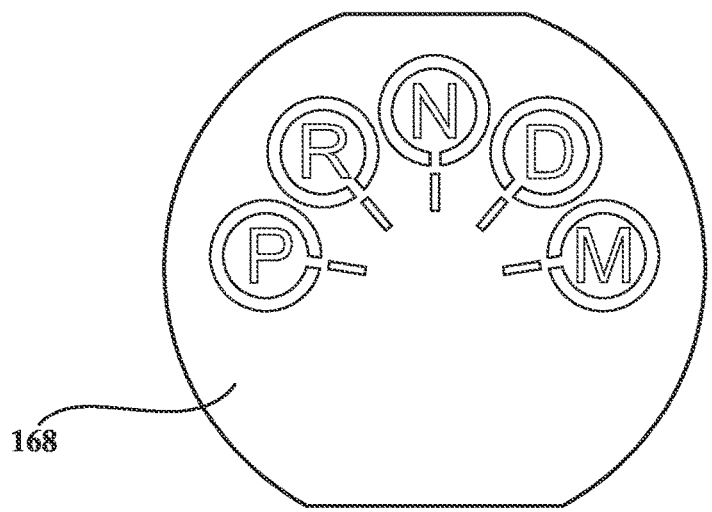
FIG. 15 illustrates a non-limiting graphical depiction of a gear shift selector such as including a thin film transistor (TFT) or segmented display option.
Figure 16A:
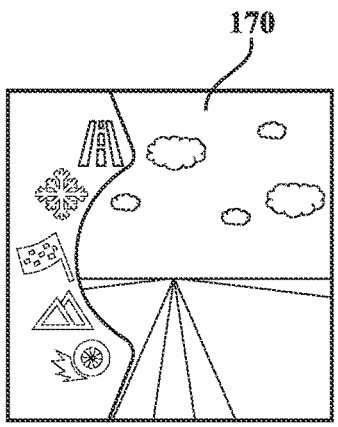
FIGS. 16A-16E provide additional subset illustrations representative of drive mod mode/terrain selector subset menu options associated with the rotary selector knob.
Figure 16B:
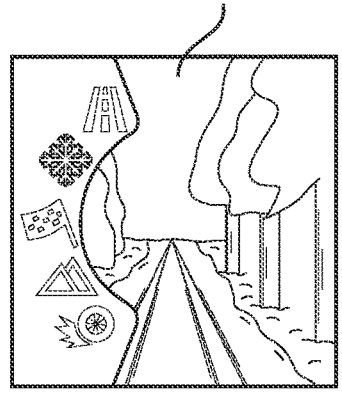
Figure 16C:
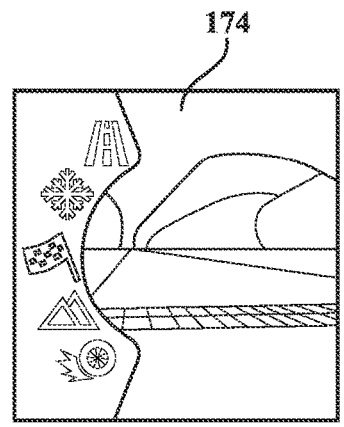
Figure 16D:
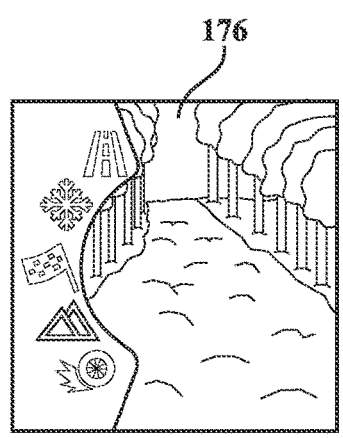
Figure 16E:
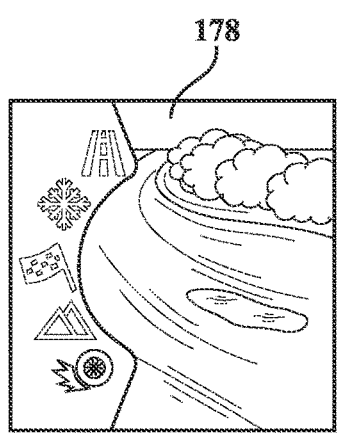

Having described the operational aspects of the rotary knob or switch (according to either the 360 degree rotational version of FIG. 9 or the individual monostable position version of FIG. 10), further reference is made to FIG. 15 which provides an illustration, at 168 of a non-limiting graphical depiction of a gear shift selector, this further exhibiting a standard PRNDM display for each of Park, Reverse, Neutral, Drive and Motor shifter positions). As previously disclosed, the display screen (as compared again to as shown at 140 in FIG. 8) can include any of a thin film transistor (TFT) display, organic light emitting (OLED) display or segmented display option with LCD panels and the like.

Finally, FIGS. 16A-16E provide additional subset illustrations representative of drive mod mode/terrain selector subset menu options associated with the rotary selector knob. These are shown at 170 (FIG. 16A) for clear road conditions, at 172 (FIG. 16B) for snowy conditions, at 174 (FIG. 16C) for racing conditions, at 176 (FIG. 16D) for challenging terrain conditions and at 178 (FIG. 16E) for rainy/wet conditions. As further previously described, the subset menu options can be accessed such through the monostable end position toggling of the rotary knob/switch in the variant of FIG. 10.

Having described my invention, other and additional preferred embodiments will become apparent to those skilled in the art to which it pertains, and without deviating from the scope of the appended claims. The detailed description and drawings are further understood to be supportive of the disclosure, the scope of which being defined by the claims. While some of the best modes and other embodiments for carrying out the claimed teachings have been described in detail, various alternative designs and embodiments exist for practicing the disclosure defined in the appended claims.

The foregoing disclosure is further understood as not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosure. It is to be understood that the forms of disclosure herein shown and described are to be taken as representative embodiments. Equivalent elements, materials, processes or steps may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application. Additionally, any signal hatches in the drawings/figures should be considered only as exemplary, and not limiting, unless otherwise specifically specified.

We claim:

1. A rotary switch assembly, comprising:
a housing having a cylindrical cross sectional shape, an aperture in said housing revealing an outwardly projecting and spring loaded pawl supported by said housing, a window being configured in a further location of said housing;
a rotatable knob having an inner cylindrical surface supported over said housing, said knob including each of an upper detent profile opposing said pawl and a lower gear profile, said detent profile including a plurality of rotational positions, with first and last monostable adjustable positions;
a spur gear having a shaft rotatably supported within said housing so that a portion of an exteriorly teethed head projects from said window in meshing engagement with said lower gear profile;
a magnet supported upon an end of said spur gear and arranged in proximity to a sensor incorporated into a printed circuit board integrated into a bottom of said housing, rotation of said knob causing said sensor to read a given rotational position of said knob and, upon outputting a signal to a microprocessor component, designating any of a shifter position or mode selection;
angled portions configured at opposite end locations of said first and last monostable positions such that toggling of said knob in either of said end positions resulting in said microcontroller presenting subset mode depictions on said surface display; and
a surface display incorporated into said knob for presenting the shifter position or mode selection.

2. The assembly of claim 1, said pawl further comprising a pair of pawls arranged in opposite facing directions within said housing, said housing aperture further including a pair of apertures seating said pawls.

3. The assembly of claim 2, further comprising a pair of coil springs seated within pockets inside said housing for outwardly biasing said pawls.

4. The assembly of claim 1, said housing further comprising an inner housing, a cylindrical shaped outer housing supported around said inner housing, a bottom cover securing said printed circuit board to said housing.

5. The assembly of claim 1, said surface display further comprising LED elements for presenting a pixelated image.

6. The assembly of claim 1, said surface display further comprising either of a thin film transistor display or an organic light emitting diode display.

7. The assembly of claim 1, said surface display further comprising a segmented LCD elements with LED backlight elements.

8. The assembly of claim 1, further comprising a harness extending from said surface display and terminating in a connector in communication with said printed circuit board.

9. The assembly of claim 8, said harness further comprising a ribbon cable controlling both individual activation and deactivation of said LCD elements.

10. The assembly of claim 1, said surface display including a clear image glass having a current selected shifter or mode selection represented in enlarged depiction.

11. The assembly of claim 1, said detent profile further comprising 360° rotational adjustability of said rotatable portion.

12. The assembly of claim 1, further comprising said microprocessor component being integrated into said printed circuit board and having a serial communication protocol not limited to any of LIN, SPI, and 12C adapted to communicate with said illuminating components in said display surface.

13. The assembly of claim 1, said microprocessor component further comprising a serial communication protocol not limited to a parallel interface between the main microcontroller and said display surface.

14. The assembly of claim 1, said knob further comprising an upper knob component and a lower assemblable knob component containing said upper detent profile and said lower gear profile.

15. A rotary switch assembly, comprising:
a housing having a cylindrical cross sectional shape, a pair of apertures in said housing revealing an outwardly projecting pair of spring loaded pawls supported by said housing, a window being configured in a further location of said housing;
a rotatable knob having an inner cylindrical surface supported over said housing, said knob including each of an upper detent profile opposing said pawl and a lower gear profile;
said detent profile further comprising a plurality of rotational positions, with first and last located mono-stable adjustable positions, angled portions configured at opposite end locations of each of said first and last monostable adjustable positions;
a spur gear having a shaft rotatably supported within said housing so that a portion of an exteriorly teethed head projects from said window in meshing engagement with said lower gear profile;
a magnet supported upon an end of said spur gear and arranged in proximity to a sensor incorporated into a printed circuit board integrated into a bottom of said housing, rotation of said knob between said rotational positions causing said sensor to read a given rotational position of said knob and, upon outputting a signal to a microprocessor component, designating any of a shifter position or mode selection, toggling of said knob in either of said monostable end positions resulting in said microcontroller presenting subset mode depictions on said surface display; and
a surface display incorporated into said rotatable knob, a harness extending from said surface display and terminating in a connector in communication with said printed circuit board for presenting the shifter position or mode selection.

16. A rotary switch assembly, comprising:
a housing have a cylindrical cross sectional shape, an aperture in said housing revealing an outwardly projecting and spring loaded pawl supported by said housing, a window being configured in a further location of said housing;
a rotatable knob having a lower portion with an inner cylindrical surface supported over said housing and including each of an upper detent profile opposing said pawl and a lower gear profile, said knob further having an upper portion attachable over said lower portion;
a spur gear having a shaft rotatably supported within said housing so that a portion of an exteriorly teethed head projects from said window in meshing engagement with said lower gear profile;
a magnet supported upon an end of said spur gear and arranged in proximity to a sensor incorporated into a printed circuit board integrated into a bottom of said housing, rotation of said knob causing said sensor to read a given rotational position of said knob and, upon outputting a signal to a microprocessor component, designating any of a shifter position or mode selection;
said detent profile further providing 360° rotational adjustability of said knob; and
a surface display incorporated into said upper portion of said rotatable knob, a harness extending from said surface display and terminating in a connector in communication with said printed circuit board for presenting the shifter position or mode selection.

17. A rotary switch assembly, comprising:
a housing having a cylindrical cross sectional shape, an aperture in said housing revealing an outwardly projecting and spring loaded pawl supported by said housing, a window being configured in a further location of said housing;
a rotatable knob having an inner cylindrical surface supported over said housing, said knob including each of an upper detent profile opposing said pawl and a lower gear profile;
a spur gear having a shaft rotatably supported within said housing so that a portion of an exteriorly teethed head projects from said window in meshing engagement with said lower gear profile;
a magnet supported upon an end of said spur gear and arranged in proximity to a sensor incorporated into a printed circuit board integrated into a bottom of said housing, rotation of said knob causing said sensor to read a given rotational position of said knob and, upon outputting a signal to a microprocessor component, designating any of a shifter position or mode selection;
a surface display incorporated into said knob for presenting the shifter position or mode selection; and
a harness extending from said surface display and terminating in a connector in communication with said printed circuit board.

18. A rotary switch assembly, comprising:
a housing having a cylindrical cross sectional shape, an aperture in said housing revealing an outwardly projecting and spring loaded pawl supported by said housing, a window being configured in a further location of said housing;
a rotatable knob having an inner cylindrical surface supported over said housing, said knob including each of an upper detent profile opposing said pawl and a lower gear profile;
said knob further including an upper knob component and a lower assemblable knob component containing said upper detent profile and said lower gear profile;
a spur gear having a shaft rotatably supported within said housing so that a portion of an exteriorly teethed head projects from said window in meshing engagement with said lower gear profile;
a magnet supported upon an end of said spur gear and arranged in proximity to a sensor incorporated into a printed circuit board integrated into a bottom of said housing, rotation of said knob causing said sensor to read a given rotational position of said knob and, upon outputting a signal to a microprocessor component, designating any of a shifter position or mode selection; and
a surface display incorporated into said knob for presenting the shifter position or mode selection.

* * * * *